(12) United States Patent
Lind

(10) Patent No.: US 9,951,421 B2
(45) Date of Patent: Apr. 24, 2018

(54) INLET FOR EFFECTIVE MIXING AND PURGING

(71) Applicant: Lam Research Corporation, Fremont, CA (US)

(72) Inventor: Gary Bridger Lind, Nevada City, CA (US)

(73) Assignee: Lam Research Corporation, Fremont, CA (US)

( * ) Notice: Subject to any disclaimer, the term of this patent is extended or adjusted under 35 U.S.C. 154(b) by 463 days.

(21) Appl. No.: 14/566,523

(22) Filed: Dec. 10, 2014

(65) Prior Publication Data

US 2016/0168705 A1 Jun. 16, 2016

(51) Int. Cl.
*C23C 16/455* (2006.01)
*H01J 37/32* (2006.01)
*C23C 16/44* (2006.01)

(52) U.S. Cl.
CPC .... *C23C 16/45565* (2013.01); *C23C 16/4408* (2013.01); *C23C 16/45512* (2013.01); *C23C 16/45574* (2013.01); *H01J 37/3244* (2013.01); *H01J 37/32357* (2013.01); *H01J 37/32449* (2013.01)

(58) Field of Classification Search
CPC ........ C23C 16/45565; C23C 16/45574; C23C 16/4408; C23C 16/45512; H01J 37/32357; H01J 37/3244; H01J 37/32449
See application file for complete search history.

(56) References Cited

U.S. PATENT DOCUMENTS

| | | | | | |
|---|---|---|---|---|---|
| 5,792,272 | A | * | 8/1998 | van Os | ............... C23C 16/4405 118/723 I |
| 5,846,330 | A | * | 12/1998 | Quirk | .................. C23C 16/4558 118/715 |
| 5,851,294 | A | * | 12/1998 | Young | ............... C23C 16/45508 118/715 |
| 5,951,771 | A | * | 9/1999 | Raney | ................. C23C 16/4551 118/723 ER |
| 5,976,261 | A | * | 11/1999 | Moslehi | ............ C23C 16/45574 118/719 |
| 6,036,783 | A | * | 3/2000 | Fukunaga | ........... C23C 16/4486 118/724 |
| 6,143,078 | A | * | 11/2000 | Ishikawa | ........... H01L 21/67017 118/715 |

(Continued)

OTHER PUBLICATIONS

U.S. Notice of Allowance dated Mar. 13, 2018, U.S. Appl. No. 14/802,920.

*Primary Examiner* — Rudy Zervigon
(74) *Attorney, Agent, or Firm* — Weaver Austin Villeneuve & Sampson LLP

(57) ABSTRACT

The present inventors have conceived of a showerhead inlet with an annular plenum and radial flow paths into a central passage. A process gas, that may include a precursor and a carrier gas, may be flowed into the annular plenum. The annular plenum and central passage may contribute to the uniform mixing of the precursor and the carrier gas. Additionally, the radial passage may be angled upward to help more effectively purge any dead legs within the central passage. The central passage may also interface with a remote plasma source valve. The remote plasma source valve may control the flow of reactive species generated by a remote plasma source into the central passage.

19 Claims, 10 Drawing Sheets

(56) References Cited

U.S. PATENT DOCUMENTS

| | | | |
|---|---|---|---|
| 6,178,918 B1* | 1/2001 | van Os | C23C 16/4405 118/715 |
| 6,270,862 B1* | 8/2001 | McMillin | C23C 16/455 427/569 |
| 6,375,750 B1* | 4/2002 | Van Os | C23C 16/4405 118/500 |
| 6,432,831 B2* | 8/2002 | Dhindsa | C23C 16/455 438/710 |
| 6,486,081 B1* | 11/2002 | Ishikawa | C23C 16/401 438/787 |
| 6,884,296 B2* | 4/2005 | Basceri | C23C 16/45514 118/715 |
| 7,303,141 B2* | 12/2007 | Han | C23C 16/4558 118/715 |
| 7,780,789 B2* | 8/2010 | Wu | C23C 16/34 118/715 |
| 7,806,078 B2* | 10/2010 | Yoshida | C23C 16/455 118/723 I |
| 9,175,394 B2* | 11/2015 | Yudovsky | C23C 16/45504 |
| 9,362,137 B2* | 6/2016 | Kang | H01L 21/31058 |
| 9,574,268 B1* | 2/2017 | Dunn | C23C 16/45512 |
| 2002/0195124 A1* | 12/2002 | Chin | B08B 7/0035 134/18 |
| 2003/0019428 A1* | 1/2003 | Ku | C23C 16/455 118/715 |
| 2003/0070620 A1* | 4/2003 | Cooperberg | C23C 16/45574 118/723 AN |
| 2004/0028810 A1* | 2/2004 | Grant | C23C 16/4412 427/248.1 |
| 2004/0035358 A1* | 2/2004 | Basceri | C23C 16/45514 118/715 |
| 2007/0062646 A1* | 3/2007 | Ogawa | H01J 37/3244 156/345.29 |
| 2008/0102203 A1* | 5/2008 | Wu | C23C 16/34 427/248.1 |
| 2008/0102208 A1* | 5/2008 | Wu | C23C 16/455 427/255.28 |
| 2011/0098841 A1* | 4/2011 | Tsuda | C23C 16/409 700/117 |

* cited by examiner

INLET FOR EFFECTIVE MIXING AND PURGING

BACKGROUND

Many semiconductor processing operations require the distribution of process gases across a large area, e.g., across a semiconductor wafer. Such distribution of gas is often accomplished through the use of a showerhead, which is typically a device that has a large number of small gas ports or gas distribution holes distributed across a generally circular area of approximately the same size as the semiconductor wafer. The process gases are fed into an internal plenum of the showerhead that is in fluidic communication with the gas ports. The process gases introduced into the internal plenum are thus able to flow through the gas ports and out onto the wafer (which is centered below the showerhead).

In some processes, multiple different gases are flowed through the showerhead in a sequential fashion to perform different steps of a semiconductor process. In other processes, like atomic layer deposition, the showerhead may have two or more internal plenums that are fluidically isolated from one another within the showerhead. Each of these internal plenums may be used to deliver a different gas to the wafer via gas ports that are dedicated to each internal plenum. Such separate plenum arrangements prevent the reactants used from mixing, which can cause a chemical reaction, before they leave the showerhead. This reduces clogging and other types of damage within the showerhead.

The plenums in showerheads are typically provided gas by way of one or more inlet tubes that are often connected directly to the showerhead. Discussed herein are improved showerhead inlet designs that provide enhanced performance over traditional inlets.

SUMMARY

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

In certain implementations, an apparatus for supplying process gases to a semiconductor processing gas distribution system may be provided. The apparatus may include a central passage configured to flow gases introduced into the central passage to the gas distribution system by flowing the gases into the gas distribution system in a first direction, an annular first plenum, a first inlet fluidically connected to the first plenum, and at least one radial flow path fluidically connecting the plenum and the central passage. Each radial flow path may be angled so as to flow a first process gas from the first plenum and into the central passage along a direction having a component opposite in direction to the first direction. The first process gas may be provided to the first plenum via the first inlet.

In some such implementations of the apparatus, the central passage may further include a first end and a second end. The first end may be located in between the radial flow path and a portion of the apparatus configured to be connected with the gas distribution system, and the second end may be located such that the radial flow path is interposed between the second end and the first end. The second end may also include a second inlet for a second process gas. The second inlet may be configured to flow the second process gas from the second end to the first end and at least a portion of the central passage may be between the area where the radial flow path connects to the central passage and the first end. In some such implementations, the second end may include a valve component configured to regulate the flow of the second process gas through the second inlet and into the central passage. In some further or additional such implementations, the central passage may be cylindrical in shape and the portion of the central passage between the area where the radial flow path joins the central passage and the second end may be at least one central passage diameter in length. In some further or additional such implementations, the second process gas may be a reactive species.

In some further or additional such implementations of the apparatus, the at least one radial flow path may be angled such that each radial flow path directs the first process gas along a flow direction at an angle of between 100 to 170 degrees from the first direction.

In some further or additional such implementations of the apparatus, the radial flow path may include a plurality of radial passages, each equal in length and cross-sectional flow area. In some such implementations, the plurality of radial passages may be distributed around the central passage in a substantially equally-spaced manner. In some such implementations, the plurality of radial passages may be distributed to flow the first process gas into the central passage in a manner that creates turbulent flow of the first process gas in at least a portion of the central passage. In some such implementations, the central passage may further include a first end and a second end, such that the first end may be located in between the radial flow path and a portion of the apparatus configured to be connected with the gas distribution system, the second end may be located such that the radial flow path is interposed between the second end and the first end, and at least a portion of the turbulent flow of the first process gas may be created between the area where the radial flow path connects to the central passage and the second end.

In some further or additional such implementations of the apparatus, the radial flow path may include a plurality of radial passages such that the plurality of radial passages includes at least a first radial passage and a second radial passage and the first radial passage and the second radial passage are angled at different angles.

In some further or additional such implementations of the apparatus, the radial flow path may include a single radial passage.

In some further or additional such implementations of the apparatus, the apparatus may further include a secondary passage fluidically isolated from the central passage and configured to flow a third process gas in the first direction and a second inlet fluidically connected to the secondary passage.

In some further or additional such implementations of the apparatus, the apparatus may further include the gas distribution system and the gas distribution system may be a gas distribution showerhead fluidically connected to the central passage. In some such implementations, the apparatus may further include a secondary passage fluidically isolated from the central passage and configured to flow a third process gas in the first direction and a second inlet fluidically connected to the secondary passage. The gas distribution showerhead may include a first distribution plenum and a second distribution plenum such that the first distribution plenum and the second distribution plenum may be fluidically isolated from one another within the gas distribution showerhead, the central passage may be fluidically connected to the first distribution plenum of the gas distribution showerhead, and the secondary passage may be fluidically connected to the second distribution plenum of the gas distribution showerhead. In some such implementations, the apparatus may further include a plurality of riser passages that are arranged in a radial pattern, fluidically connected to the central passage and the first distribution plenum, and substantially centered on, and fluidically isolated from, the secondary passage. In some such implementations, at least a portion of the secondary passage may be between at least two of the riser passages.

In certain implementations, an apparatus for processing semiconductor wafers may be provided. The apparatus may include a first process gas valve fluidically connected to a first inlet of a showerhead inlet and configured to flow a first process gas into the first inlet, a carrier gas valve fluidically connected to the first inlet and configured to flow a carrier gas into the first inlet, and a second process gas valve fluidically connected to a central passage of the showerhead inlet and configured to flow a second process gas into the central passage. The apparatus may also include a semiconductor processing gas distribution system, and the showerhead inlet may be configured to supply gases to the semiconductor processing gas distribution system. The showerhead inlet may include the central passage, which may be configured to flow gases introduced into the central passage to the gas distribution system by flowing the gases into the gas distribution system in a first direction, an annular first plenum, the first inlet fluidically connected to the first plenum, and at least one radial flow path fluidically connecting the plenum and the central passage, each radial flow path angled so as to flow the first process gas and/or the carrier gas from the first plenum and into the central passage along a direction having a component opposite in direction to the first direction. The first process gas and/or the carrier gas may be provided to the first plenum via the first inlet. The apparatus may further include a controller with one or more processors and a memory. The one or more processors, the memory, the first process gas valve, and the second process gas valve may be communicatively connected. The memory may store program instructions for controlling the one or more processors to: (i) cause the carrier gas valve to flow the carrier gas into the first inlet, (ii) cause the first process gas valve to flow the first process gas into the first inlet; and (iii) cause, after (ii), the first process gas valve to stop the flow of the first process gas into the first inlet.

In some such implementations of the apparatus, the central passage may further include a first end and a second end. The first end may be located in between the radial flow path and a portion of the apparatus configured to be connected with the gas distribution system, the second end may be located such that the radial flow path is interposed between the second end and the first end, the second end may be configured to be connected with the second process gas valve. The apparatus may also include a second inlet for the second process gas, the second inlet configured to flow the second process gas from the second end to the first end, and at least a portion of the central passage may be between the area where the radial flow path connects to the central passage and the first end.

In some further or additional such implementations of the apparatus, the memory may store further program instructions for controlling the one or more processors to: (iv) cause, after (iii), the second process gas valve to flow the second process gas into the central passage, and (v) cause, after (iv), the second process gas valve to stop the flow of the second process gas into the central passage.

In some further or additional such implementations of the apparatus, the apparatus may further include a third process gas valve and the showerhead inlet may further include a secondary passage fluidically isolated from the central passage and configured to flow a third process gas in the first direction and a second inlet fluidically connected to the secondary passage and the third process gas valve. The third process gas valve may be configured to regulate the flow of the third process gas to the secondary inlet, and the gas distribution system may include a first distribution plenum and a second distribution plenum such that the first distribution plenum and the second distribution plenum are fluidically isolated from one another within the gas distribution system. The central passage may be fluidically connected to the first distribution plenum of the gas distribution showerhead, the secondary passage may be fluidically connected to the second distribution plenum of the gas distribution showerhead, and the memory may store further program instructions for controlling the one or more processors to: (iv) cause, after (iii), the third process gas valve to flow the third process gas into the secondary inlet, and (v) cause, after (iv), the third process gas valve to stop the flow of the third process gas into the secondary inlet.

These and other features of the invention will be described in more detail below with reference to the drawings.

BRIEF DESCRIPTION OF THE DRAWINGS

FIGS. 1, 3A, 3B, and 4 are drawn to-scale within each Figure, although the scale from Figure to Figure may differ.

DETAILED DESCRIPTION

Figure 1:
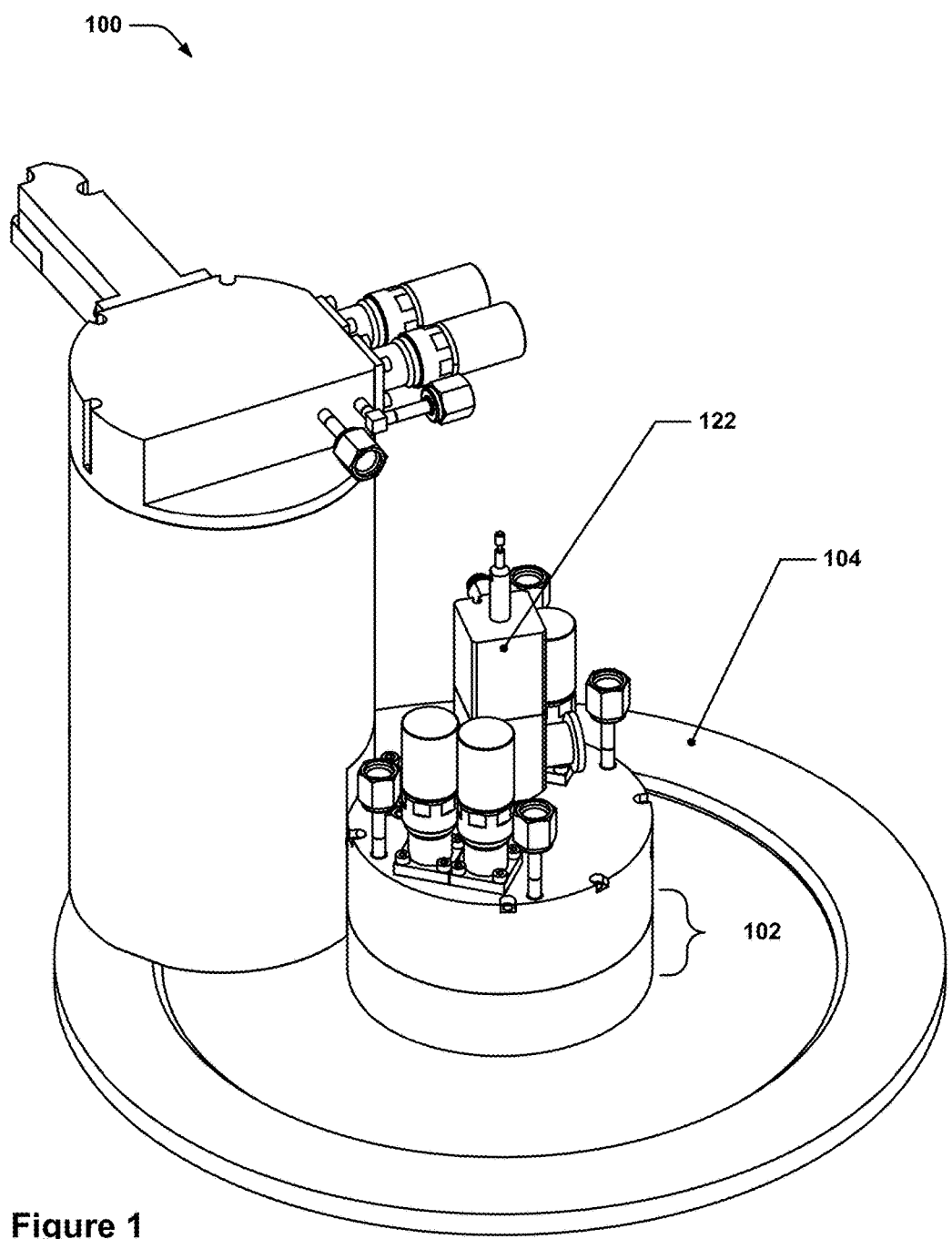
FIG. 1 depicts a view of an example process gas distribution assembly.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

It is to be understood that, as used herein, the term "semiconductor wafer" may refer both to wafers that are made of a semiconductor material, e.g., silicon, and wafers that are made of materials that are not generally identified as semiconductors, e.g., dielectrics and/or conductors, but that typically have semiconductor materials provided on them. Silicon on insulator (SOI) wafers are one such example. The apparatuses and methods described in this disclosure may be used in the processing of semiconductor wafers of multiple sizes, including 200 mm, 300 mm, and 450 mm diameter semiconductor wafers.

Semiconductor wafers are frequently processed inside of substrate processing chambers through operations that may include exposing the semiconductor wafer to a process gas. The substrate processing chambers may include showerheads that deliver the process gas to semiconductor wafers located within the substrate processing chamber. The process gases used to process substrates during various processing stages may include, for example, carrier gas(es), precursor(s) (gaseous and/or vaporized liquid), and/or purge gas(es). The showerhead may include a combination of one or more flow paths and plenums and may, for example, be designed to mix process gases, e.g., mix a precursor with a carrier gas, before flowing the process gases to the showerhead for delivery to the substrate.

The present inventor has conceived of a showerhead inlet designed for uniform mixing of the precursor and the carrier gas prior to their introduction into the showerhead plenums and for effective purging of any dead legs within the showerhead inlet's internal flow paths. The showerhead inlet may include a central passage through which gas may be flowed into the showerhead. The central passage may be fluidically joined to an annular plenum that encircles the central passage by one or more radial flow paths; each radial flow path may be angled such that fluid flow along the radial flow paths from the annular plenum to the central passage has a directional component that is opposite the primary direction of flow in the central passage towards the showerhead. The central passage may be capped off, either permanently or by way of a valve, at a point further along the central passage and offset from the point at which the radial flow path or paths intersect with the central passage, thus creating a dead zone (either permanently or when the valve, if present, is closed) between the cap and the radial flow path or paths.

Such a showerhead inlet may be suitable for use in any semiconductor tool performing any of various types of semiconductor wafer or substrate processing operation, but may be especially suitable for use in processes such as Atomic Layer Deposition (ALD) and Atomic Layer Etching (ALE). ALD is a film-forming technique which is well-suited to the deposition of conformal films due to the fact that a single cycle of ALD only deposits a single, but uniformly thin, layer of material. Multiple ALD cycles may then be used to build up a film of the desired thickness, and since each layer is thin and conformal, the resulting film substantially conforms to the shape of the underlying device structure. ALE is the inverse of ALD and is an etching technique used to selectively and precisely remove targeted materials on a semiconductor wafer due to the fact that a single cycle of ALE only removes a single layer of material.

Referring back to ALD, an ALD process for forming multiple film layers on a substrate within a chamber may begin with a first operation of providing a precursor onto a substrate such that the precursor is adsorbed to form a layer on the substrate, followed by a second operation of removing excess precursor and/or reactant byproduct from the volume surrounding the substrate. Thereafter, in a third operation, the adsorbed precursor is reacted with a reactant to form a film layer on the substrate, and following that, in a fourth operation, desorbed film precursor and/or reaction byproduct are removed from the volume surrounding the film layer.

The process gas(es) used in substrate processing operations may be distributed with a process gas distribution assembly located within a semiconductor tool. FIG. 1 depicts a view of an example process gas distribution assembly. The process gas distribution assembly 100 in FIG. 1 may be a distribution assembly used in an ALD process. The process gas distribution assembly 100 includes a showerhead inlet 102, a showerhead backplate 104, and a remote plasma source (RPS) valve 122 (the showerhead backplate 104 may be connected with a showerhead faceplate (not shown in this Figure) to form a gas distribution showerhead).

The showerhead inlet 102 is connected to the showerhead backplate 104. The showerhead inlet may distribute process gas to the showerhead backplate 104. Process gas(es) may be distributed to the showerhead inlet 102 through various lines and manifolds connected to the showerhead inlet 102. The various lines and manifolds connected to the showerhead inlet 102, as well as the remaining components of the showerhead, are not shown in FIG. 1. In certain implementations, a precursor is mixed with carrier gas to create a first process gas that is a combination of the precursor and the carrier gas before the first process gas is flowed into the showerhead inlet 102.

In some implementations, reactive species of disassociated clean gases generated by a remote plasma source may be introduced into a flow path or flow paths within the showerhead inlet 102. In certain implementations, the reactive species may be used to activate a deposition process. The introduction of the reactive species generated by the remote plasma source into a flow path or flow paths within the showerhead inlet 102 may be controlled by the RPS valve 122. The reactive species may be used for cleaning operations during substrate processing.

In certain substrate processing operations using the process gas distribution assembly 100 the substrate may be alternately exposed to a first process gas and a second process gas. The first process gas and the second process gas may react if exposed to one another. Accordingly, effective purging of the process gases from the showerhead inlet, showerhead, and/or the chamber may be necessary in order to prevent unwanted reactions. To perform a purge, an inert gas is typically flowed through the showerhead inlet, the showerhead plenum(s), and the chamber to push any residual process gas out of the respective volumes. Thus, the showerhead inlet 102 may deliver a plurality of different process gases as well as purge gas depending on the phase of the substrate processing operation currently being performed.

Figure 2:
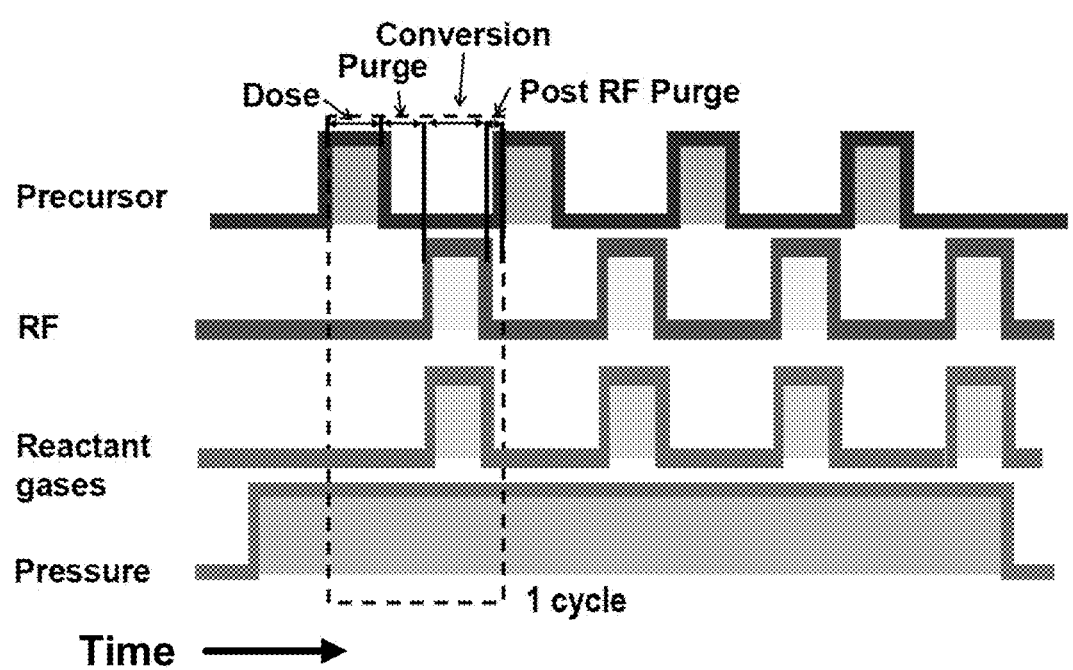
FIG. 2 is a timing diagram showing basic sequence of operations for forming films of material on a substrate via a deposition process.

An example of such a substrate processing operation is illustrated in FIG. 2. FIG. 2 is a timing diagram showing basic sequence of operations for forming films of material on a substrate via a deposition process. FIG. 2 illustrates the process steps for four deposition cycles of an ALD operation, with each cycle including the process steps of precursor delivery, RF power delivery, purging, and reactant gas delivery. The process steps in FIG. 2 are shown through their corresponding lines and are presented as Boolean values, either on or off. A process step is on if its corresponding line is in the "on" position illustrated in FIG. 2 (high) and a process step is off if its corresponding line is in the "off" position illustrated in FIG. 2 (low).

During all four deposition cycles, the processing chamber may be pressurized. One cycle of deposition is highlighted in FIG. 2. In that one cycle, the first phase of the deposition cycle may be a dose phase. During the dose phase, a first process gas, e.g., a process gas including a precursor, is delivered to the processing chamber, but the RF power is off and reactant gas or gases are not delivered. During the dose phase, the substrate may adsorb the first process gas and form an adsorption layer on the substrate.

After the dose phase, there may then be a purge phase of the deposition cycle. During the purge phase, the delivery of the first process gas may stop and a purge gas may flow through the showerhead, showerhead inlet, and the processing chamber, but the RF power may still be off. The purge phase may remove at least some unadsorbed film precursor and/or reactant byproduct from the volume surrounding the substrate as well as purge the showerhead, showerhead inlet, and the processing chamber of any remaining first process gas. In some cases, the purge gas also acts as a carrier gas for reactants in the first process gas during the dose phase, and the reactant supply is simply turned off during the purge phase to allow only carrier gas to flow.

After the purge phase, the deposition cycle may then enter the conversion phase. During the conversion phase, a second process gas, e.g., a process gas containing one or more other reactant gases, is introduced to the processing chamber via the showerhead and showerhead inlet and RF power is turned on to generate plasma while the second process gas is delivered. During the conversion phase, the adsorbed first process gas may be reacted with the second process gas to form a film layer on the substrate.

Finally, after the conclusion of the conversion phase, the deposition cycle may enter the post-RF purge phase. The post-RF purge phase may remove desorbed process gases and/or reaction byproduct from the volume surrounding the substrate after reacting the adsorbed precursor. A purge gas, similar or different to the purge gas used during the earlier purge phase, may purge the showerhead, showerhead inlet, and the processing chamber of leftover process gas and/or reactive species generated by the plasma in a similar manner to that of the earlier purge phase.

The present inventor has realized that as process gases may react to form undesired byproducts when intermixed, an ideal ALD process would have crisp on-and-off deliveries of the process gases to the substrate, similar to that illustrated in FIG. 2, to aid in consistent adsorption of the process gases by the substrate, along with effective purging in between the dose and conversion phases. Additionally, the present inventor has realized that delivery of the process gases, as well as the purge of the process gases, should be performed as quickly as possible to maximize substrate processing throughput.

Figure 3A:
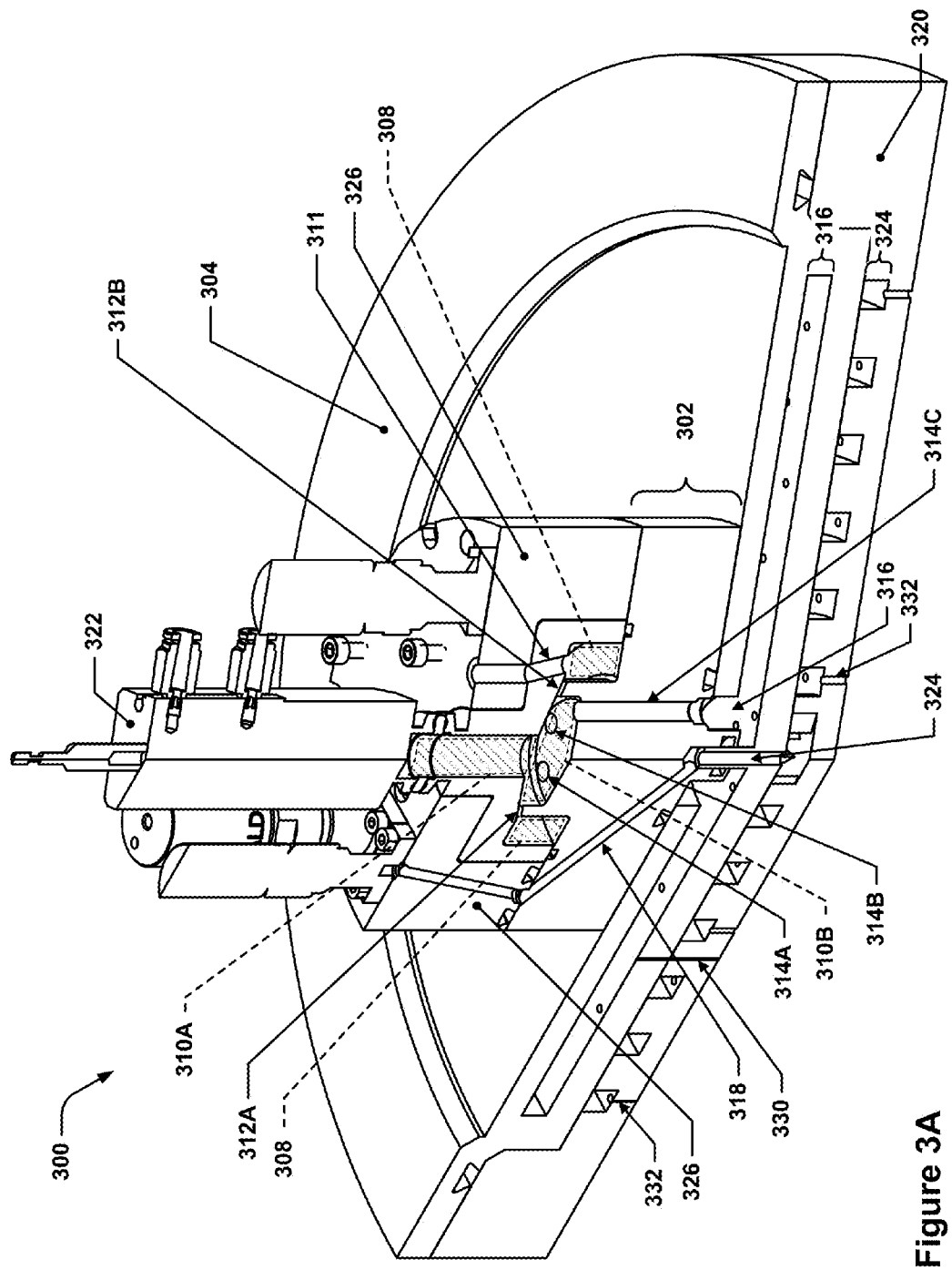
FIG. 3A depicts a cutaway view of an example process gas distribution apparatus with a showerhead inlet.

FIG. 3A depicts a cutaway view of an example process gas distribution apparatus with a showerhead inlet. The process gas distribution apparatus 300 in FIG. 3A includes a showerhead inlet 302, a showerhead back plate 304, a showerhead faceplate 320 (the showerhead back plate 304 and the showerhead faceplate 320 may, together, form a showerhead when assembled together), and a showerhead port adapter 326.

The showerhead inlet 302 shown in FIG. 3A includes a first process gas inlet 311, an annular plenum 308, radial flow paths 312A and 312B, an upper central passage 310A, a lower central passage 310B, riser paths 314A-C, and a second process gas passage 318. The upper central passage 310A may be fluidically connected to an RPS valve 322. The RPS valve 322 may regulate the flow of reactive species generated by an RPS (not shown in FIG. 3A) into the upper central passage 310A.

A second process gas may flow into the second process gas passage 318. Both the first process gas and the second process gas may ultimately flow into flow paths within the showerhead back plate 304 and the showerhead faceplate 320. In the process gas distribution apparatus shown in 300, the first process gas and the second process gas may be kept separate until the respective process gases have flowed out of the showerhead faceplate 320 and into a substrate processing chamber. That is, the first process gas has one flow path to the processing chamber, while the second process gas has a different flow path to the processing chamber. Such a configuration prevents unwanted reactions between the two process gases within the showerhead or showerhead inlet.

To keep the process gases separate, the process gas distribution apparatus 300 includes a showerhead back plate and showerhead configuration that may be called a "dual-plenum showerhead." A dual-plenum showerhead is designed to distribute two or more different process gases into a substrate processing chamber. The dual-plenum showerhead has two separate flow paths within the showerhead so that the flow of at least a first process gas and a second process gas are kept separate until the process gases are distributed into a substrate processing chamber.

The showerhead back plate 304 includes a first showerhead plenum 316. The first showerhead plenum 316 may be fluidically connected to the riser paths 314A-C and may distribute the first process gas to first process gas showerhead flow paths 330 within the showerhead faceplate 320. The first process gas may then flow into the processing chamber for adsorption by a substrate. Additionally, the showerhead back plate 304 and the showerhead faceplate 320 also define a second showerhead plenum 324. The second showerhead plenum 324 may be fluidically connected to the second process gas passage 318 and may distribute the second process gas to second process gas showerhead flow paths 332 within the showerhead faceplate 320. The second process gas may then flow into the processing chamber.

Figure 3B:
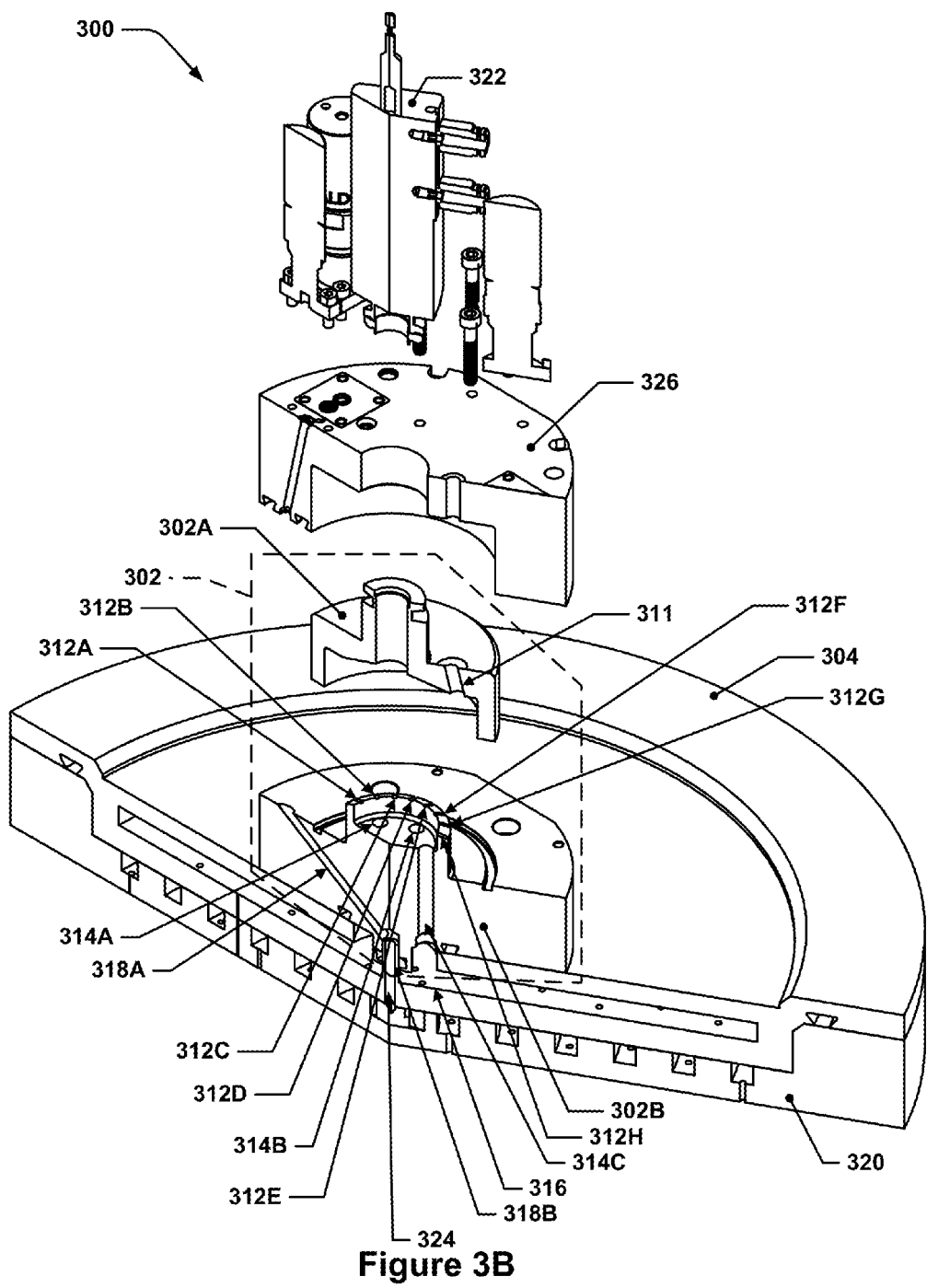
FIG. 3B depicts an exploded view of the example process gas distribution apparatus of FIG. 3A.

FIG. 3B depicts an exploded view of an example process gas distribution apparatus of FIG. 3A. In addition to the showerhead inlet 302, the showerhead back plate 304, the showerhead faceplate 320, and the RPS valve 322, FIG. 3B separately indicates a showerhead port adapter 326. In the implementation shown, the showerhead inlet 302 includes two separate pieces, an upper showerhead inlet 302A and a lower showerhead inlet 302B, that are shown within a region indicated by a broken line. The upper showerhead inlet 302A and the lower showerhead inlet 302B may be assembled into a complete showerhead inlet 302, e.g., using removable fasteners (as shown), brazing, or other joining techniques. Other implementations may have the showerhead inlet be one piece, or more than two pieces.

The showerhead port adapter 326 may direct the flow of process gases, which may flow through various internal flow paths and exterior gas lines of the showerhead port adapter 326 and controlled by valves, to the showerhead inlet 302. The process gases may be provided to the showerhead port adapter 326 from various facility process gas sources. In certain implementations, if a process gas is a mixture of component fluids such as, for example, a precursor and a carrier gas, the process gas may be fully mixed before the process gas enters the showerhead inlet 302. In other implementations, a process gas that is a mixture of component fluids may not be fully mixed upon introduction to the showerhead port adapter 326 and may instead become mixed within the showerhead inlet 302. In such implementations, the component fluids may be kept within the separate showerhead port adapter 326 until the component fluids have flowed into the showerhead inlet 302. In the implementation shown in FIG. 3B, the showerhead port adapter 326 directs the flow of a first process gas into the first process gas inlet 311 of the showerhead inlet 302 and directs the flow of a second process gas into the second process gas passage 318, which may be subdivided into second process gas passages 318A and 318B, as shown in FIG. 3B. The second process gas passage 318A may also be referred to herein as the secondary inlet and the second process gas passage 318B may also be referred to herein as the secondary passage. The second process gas passage 318A may flow a second process gas into the second process gas passage 318B. In the implementation shown, the second process gas passage 318A has one end of the passage outside of the annular plenum 308 with the other end located at one end of the second process gas passage 318B. The second process gas passage 318B in FIG. 3 may be located substantially coaxially with the central passages 310A and 310B (shown in FIG. 3A) as both the second process gas passage 318B as well as the central passages 310A and 310B may be substantially cylindrical.

Referring back to the first process gas, the first process gas may flow into the showerhead inlet 302 through the first process gas inlet 311. The first process gas inlet 311 shown in FIG. 3 is a single process gas inlet, but other configurations of the showerhead inlet 302 may have multiple such process gas inlets, such as, but not limited to, two to ten or more process gas inlets. In certain implementations, the first process gas may be a precursor mixed with a carrier gas. Suitable carrier gasses include, but are not limited to, hydrogen, argon, and nitrogen.

After the first process gas enters the showerhead inlet 302 via the first process gas inlet 311, the first process gas may then flow to the annular plenum 308. In some implementations, the annular plenum may be only partially annular, e.g., C-shaped or otherwise only partially encircling the central passage. The annular plenum may also, in some implementations, not be truly annular—for example, the annular plenum may have an octagonal cross-section in a plane perpendicular to the central passage, thus giving rise to an annular plenum that has radial symmetry instead of axial symmetry. It is to be understood that the term "annular plenum" may refer to plenums that extend around part or all of the central passage in a plane perpendicular to the central passage flow direction, regardless of the exact shape such plenums have. The annular plenum may have a circular, oval, polygonal, or other cross-sectional geometry. Process gases that are introduced into the annular plenum before being flowed into the central passage via radial passages may undergo mixing in the annular plenum that results in a more even gas distribution within the central passage once the process gases are flowed into the central passage.

As indicated above, the process gases may then flow from the annular plenum and into the central passage via radial flow paths 312A-H. The radial flow paths 312A-H may be defined by features from both the upper showerhead inlet 302A and the lower showerhead inlet 302B. Also, in the implementation shown, the annular plenum and the central passage of the showerhead inlet 302 are also defined by features from both the upper showerhead inlet 302A and the lower showerhead inlet 302B. In certain other implementations of a multi-piece showerhead inlet, the plenums and flow paths within the showerhead inlet may be defined by features in only one piece of the showerhead inlet.

In the implementation shown, the radial flow paths 312A-H fluidically connect the annular plenum to the central passage. The radial flow paths 312A-H may allow for a relatively even distribution of the first process gas to the central passage, leading to a uniformly mixed precursor and carrier gas combination that allows for even distribution of precursor onto the substrate. Various configurations of possible flow paths geometries are detailed in other parts of this disclosure.

The radial flow paths may be angled such that first process gas exiting into the central passage from the radial flow paths is traveling in a flow direction where a component of the flow direction is opposite that of the exit flow direction from the central passage, i.e., towards the showerhead. Put another way, the radial flow paths may flow the first process gas in a direction where at least a component of the direction is leading away from the showerhead faceplate 320.

Referring back to FIG. 3A, in the showerhead inlet 302, the central passage is divided into an upper central passage 310A and a lower central passage 310B. The central passage, in addition to supplying a process gas to the showerhead, may also be used to supply reactive species generated by an attached RPS. The RPS is not shown in FIG. 3A, but in certain implementations, may be connected to the upper central passage 310A. The flow of reactive species generated by the RPS may be controlled by the RPS valve 322; when the RPS valve 322 is closed, the valve may form a boundary surface of the upper central passage 310A. When the RPS valve 322 is open, reactive species generated by the RPS may be flowed through the upper central passage 310A to the lower central passage 310B and then through the riser paths 314A-C to the showerhead. A flow of carrier gas into the central passage by way of the radial passages may be maintained during the flow of the reactive species to prevent the reactive species from back-flowing into the annular plenum 308.

After the first process gas has entered the central passage, it may flow from the central passage to the first showerhead plenum 316 via the riser paths 314A-C. The cutaway FIGS. 3A and 3B show three riser paths 314A-C, though there are an additional three riser paths not shown in FIGS. 3A and 3B due to the section planes used in the figure. Other implementations may include one or multiple riser paths. In certain implementations, certain passages within the showerhead inlet 302 such as the riser paths may, as shown, be sized as large as possible (while still preserving radial symmetry and space to accommodate, for example, the second process gas passages 318A and 318B) to reduce the number of collisions that free radicals in the reactive species may experience as they travel through the showerhead inlet 302, thus reducing potential free radical recombination with the walls of the showerhead inlet 302.

The riser paths of the implementations shown in FIGS. 3A and 3B allow first process gas to flow around the second process gas passages 318A and 318B, allowing for the first process gas and the second process gas to be kept separated. Such an implementation may flow the first process gas and the second process gas into a dual plenum showerhead. The dual plenum showerhead may keep the first process gas and the second process gas separate until the process gases have been flowed through the showerhead faceplate and into a substrate processing chamber.

A second process gas may flow into the second process gas passage 318A via a flow path or multiple flow paths. In the process gas distribution apparatus 300, the second process gas may flow into the second process gas passage 318A via a flow path within the showerhead port adapter 326. The second process gas may flow from the second process gas passage 318A into the second process gas passage 318B. The second process gas passages 318B may be fluidically connected to the second showerhead plenum 324 at a central location at the bottom of the showerhead inlet 302. In certain implementations, delivering process gas to the showerhead in a manner that is radially symmetrical from the perspective of the showerhead may aid in the uniform delivery of the process gas to various radial segments of the showerhead plenum. In such a configuration, at least a portion of the second process gas passage 318B may be positioned in between at least two of the riser paths. Accordingly, a plurality of riser paths may be needed in order for the riser paths to be arranged around the second process gas passage 318B in a symmetrical manner. Such a configuration is shown in the process gas distribution apparatus 300 as the first process gas is delivered to the first plenum in a radially symmetrical manner via the riser paths while the second process gas is delivered to the second plenum from a central location that is also radially symmetrical from the perspective of the showerhead.

In certain other implementations, the showerhead inlet 300 may not flow a second process gas and, instead, a single process gas may be flowed into a single plenum showerhead. In such implementations, a plurality of riser paths may not be needed and a single large riser path, of possibly a similar cross section to the central passage, may be used instead.

Figure 4:
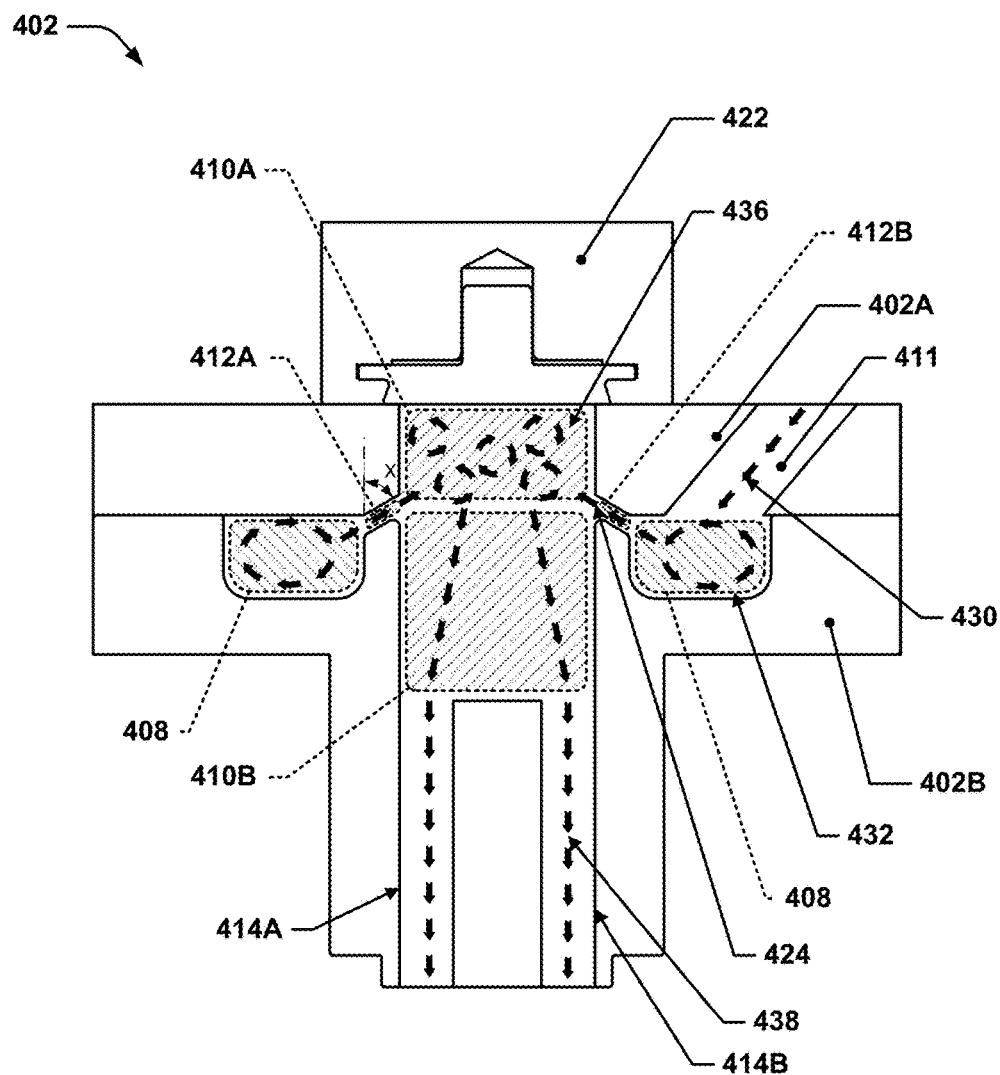
FIG. 4 depicts a section view of an example showerhead inlet with illustrated flow paths.

FIG. 4 depicts a section view of an example showerhead inlet with illustrated flow paths. The example showerhead inlet in FIG. 4, may be similar to the showerhead inlet 302 in FIGS. 3A and 3B.

The showerhead inlet 402 in FIG. 4 may be made of two components: an upper showerhead inlet 402A and a lower showerhead inlet 402B. When assembled, the upper showerhead inlet 402A and the lower showerhead inlet 402B may combine to define certain flow paths and plenums of the showerhead inlet 402, including an annular plenum 408 as well as radial flow paths 412A and 412B. A showerhead inlet made of two or more components may simplify the manufacture of the showerhead inlet. Additionally, the materials used in each piece may be varied according to the chemical composition of any precursor, reactive species, reactant, purge gas, and other chemicals used during deposition that the manifold block is expected to be exposed to. In certain implementations, the two pieces may be two different materials. For example, the upper showerhead inlet 402A may be aluminum while the lower showerhead inlet 402B may be tungsten. In other implementations, the manifold block may be one block, e.g., a cast component, or there may be more than two blocks forming the manifold block.

The showerhead inlet 402 may include a process gas inlet 411, an annular plenum 408 (shown in both the left and the right of the Figure, but actually interconnected), radial flow paths 412A and 412B, a central passage with an upper central passage 410A and a lower central passage 410B, and two riser paths 414A and 414B (additional such riser paths may be included as needed to distribute process gas in a more even manner). Additionally, an RPS valve 422 is also shown in FIG. 4. The arrows shown in FIG. 4 represent various aspects of the flow of a process gas flowed through the showerhead inlet 402.

As described in the description for FIG. 3, the process gas may enter the showerhead inlet 402 via the process gas inlet 411. Additionally, purge gas may be simultaneously (or separately) introduced into the annular plenum 408, either through the process gas inlet 411 or through an optional separate inlet (not shown) into the annular plenum 408. The flow of the process gas and/or purge gas through the process gas inlet 411 is represented by arrows 430.

The process gas, which may include a precursor and/or purge gas, may then flow from the process gas inlet 411 into the annular plenum 408, where the components of the process gas, if any, may further mix. The mixing of the precursor with carrier gas in the annular plenum 408 is represented circular arrows 432. Mixing of the precursor with carrier gas within the annular plenum may be through diffusion, through turbulence, or through other ways of mixing. In certain implementations, the flow of any precursor, purge gas, reactant, reactive species, or other process gases through the plenums and the flow paths of the showerhead inlet 402 may be at a high rate of speed. In such implementations, the process gases described above may be flowed at a pressure of about 6 to 10 Torr. The annular plenum may be appropriately sized to promote uniform mixing at high rates of flow speed.

After mixing in the annular plenum 408, the process gas may then flow through the radial flow paths 412A and 412B, as represented by arrows 424. The radial flow paths may be angled "upwards" (with respect to the orientation of the drawing page; this angle is shown by dimension "X") such that the process gas may then flow into the upper central passage 410A before changing direction and flowing in the direction of the showerhead (towards the outlet of the showerhead inlet 402—in the Figure, this is in the "downwards" direction). This results in the gas that is flowed into the upper central passage 410A developing a velocity component that is in a direction that is opposite of the general flow direction out of the showerhead inlet 402. The upper central passage 410A may be a dead leg within the central passage. The dead leg may be a result of incorporating the RPS valve 426 within the gas distribution apparatus to control the flow of reactive species for use in substrate processing. The RPS valve 426 may control the introduction of the species. Opening the RPS valve 426 may introduce reactive species to the central passage, while closing the RPS valve 426 may prevent the introduction of reactive species to the central passage. When the RPS valve 426 is closed, a dead leg may be created in the space between the RPS valve 426 and the radial flow paths 412A and 412B.

Angling the radial flow paths "upward" may assist in quicker purging of the upper central passage 410A with purge gas due to the turbulence (shown by arrows 436) that occurs in the gas in the upper central passage 410A when the purge gas reverses direction (this same turbulence may also promote more even mixing of any reactants that are entrained in the carrier gas during scenarios when both purge gas and reactant gas(es) are flowing simultaneously). Accordingly, during a purge phase, flow of reactants such as precursor may be turned off and purge gas (which may be the carrier gas used in the process gas or may be a different gas) may be flowed through the showerhead inlet 302 in the same manner as discussed above with respect to the carrier gas flow, purging the reactants from within the showerhead inlet 302. The upward angle of the radial flow paths may direct the purge gas upward into the upper central passage 410A to assist in the sweeping of any remaining reactant or reactive species from the plasma left over in the upper central passage 410A from the various deposition processes. Various implementations of the showerhead inlet may angle the radial flow paths at angles X between 10 to 80 degrees from the nominal exit flow direction axis. In certain implementations, the angles of various radial flow paths may vary within a single showerhead inlet. For example, a showerhead inlet may have radial flow paths angled upward at both 60 degrees and 45 degrees from the nominal exit flow direction axis.

After the process gas and/or purge gas has flowed through the upper central passage 410A, the process gas and/or purge gas may then flow back past the radial passages 412A and 412B and into the lower central passage 410B and then through the riser paths 414A and 414B into a showerhead (not shown). The downward flow of the process gas and/or purge gas towards the showerhead is represented by arrows 438.

Figure 5A:
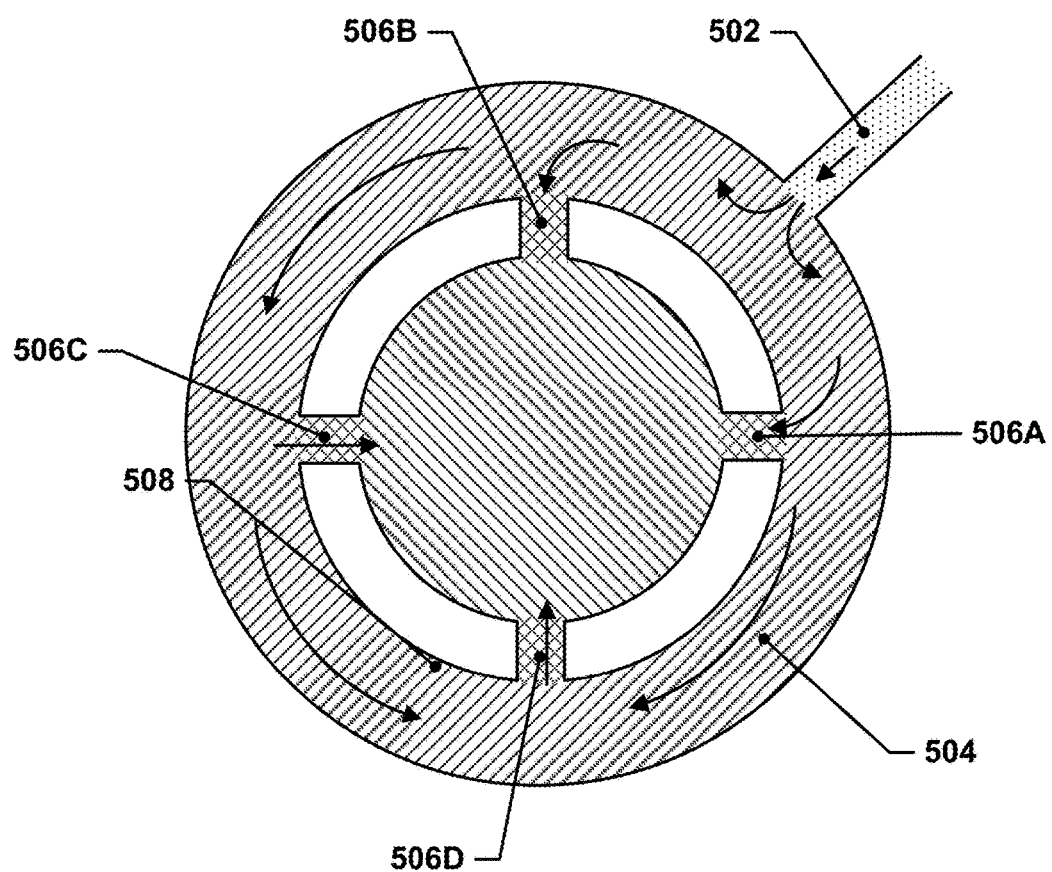
FIG. 5A depicts a view of one configuration of an example flow path of a showerhead inlet.

Referring back to the radial flow paths, FIG. 5A depicts a view of one configuration of an example flow path of a showerhead inlet. FIG. 5A shows a showerhead inlet 502, an annular plenum 504, radial flow paths 506A-D, and a central passage 508. The perspective of FIG. 5A is that of looking directly downward at the lower central passage from the upper central passage. The arrows in FIG. 5A show examples of flows of process gas within the showerhead inlet 502.

In FIG. 5A, there are four radial flow paths, radial flow paths 506A-D. In various implementations, the radial flow paths 506A-D may be of various different geometries. For example, the cross-section of the radial flow paths 506A-D may be circular, oval, semicircular, rectangular, polygonal, or other shapes. In implementations where there are multiple components forming a showerhead inlet, the radial flow paths may be defined by one, two, or multiple components. For example, grooves may be cut in adjacent or facing surfaces of two components, or may be cut in a surface of only one component, to define the cross-section of the radial flow paths. Additionally, the number of radial flow paths may vary. Certain implementations may include between 1 to 20 or more radial flow paths.

Figure 5B:
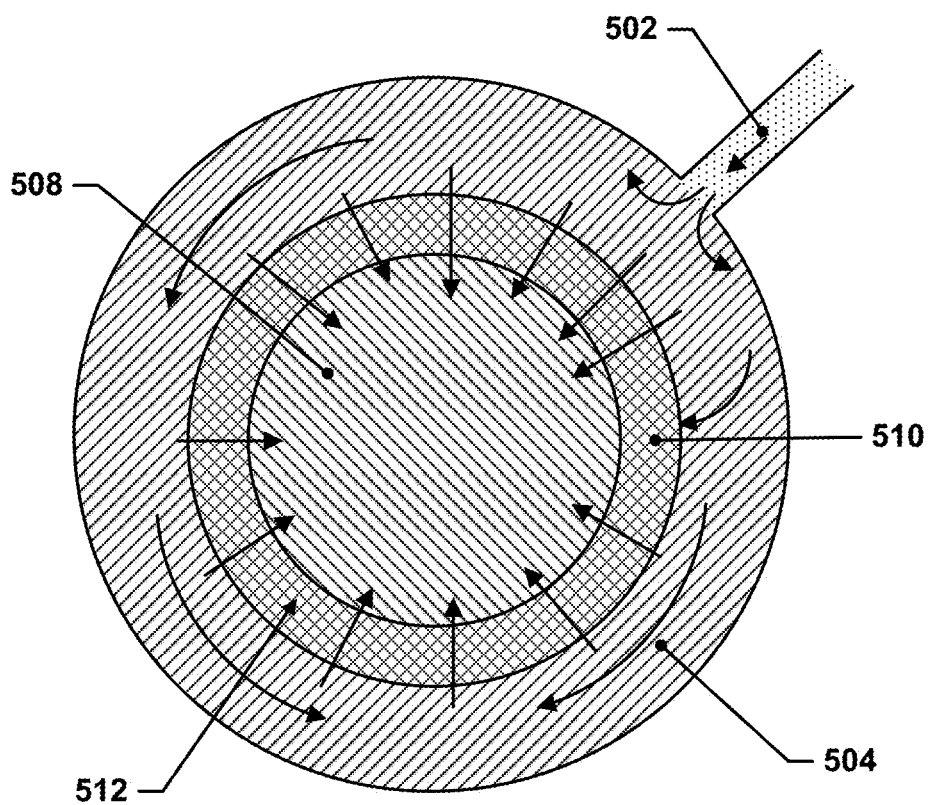
FIG. 5B depicts a view of another configuration of an example flow path of a showerhead inlet.

FIG. 5B depicts a view of another configuration of an example flow path of a showerhead inlet. FIG. 5B shows a showerhead inlet 502, an annular plenum 504, a radial flow path 510, and a central passage 508. The arrows in FIG. 5B show examples of flows of process gas within the showerhead inlet 502. The radial flow path 510 in this example is a single radial flow path that extends around the entire perimeter of the central passage (whereas the radial flow paths of FIG. 5A exhibited radial symmetry, the radial flow path of FIG. 5B exhibits axial symmetry).

Figure 5C:
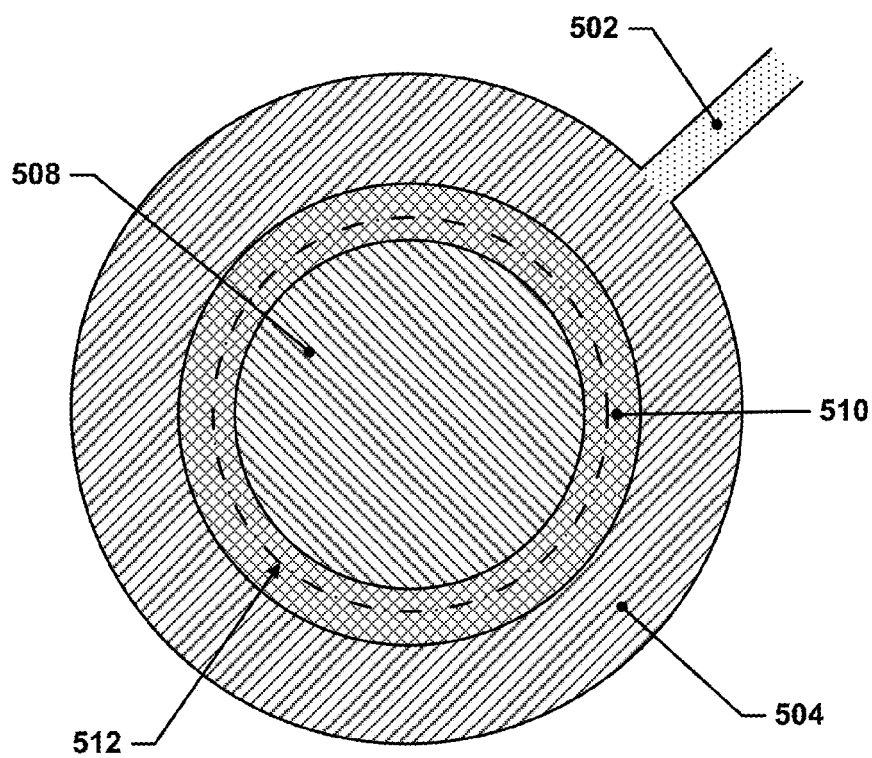
FIG. 5C depicts three example cross-sections of radial flow paths.
Figure 5C:
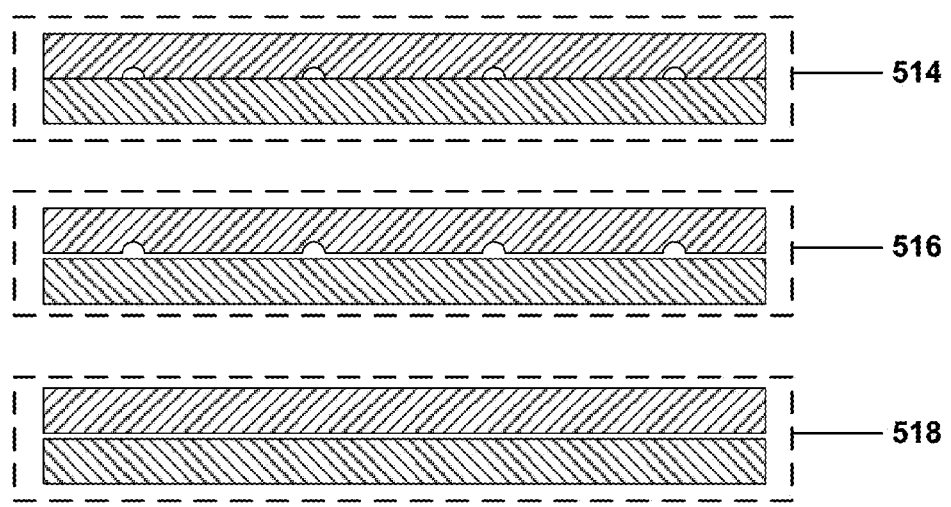

Radial flow paths may have various cross-sections. FIG. 5C depicts three example cross-sections of radial flow paths. FIG. 5C shows various example cross-sections of radial flow paths along the broken and dotted circular line 512 of a showerhead inlet. The three example cross-sections are example radial flow path cross-sections about the circumference of the broken and dotted line 512, rolled out flat. In the cross-sections 514, 516, and 518, the cross-hatched areas represent areas with material while the open spaces between the cross-hatched areas represent open paths that may flow process gas.

Cross-section 514 is a cross-section with discrete radial flow paths. By contrast, cross-section 516 is a cross-section with a contiguous flow path about the circumference of the dotted circular line 512 with a plurality of channels distributed along the circumference that result in increased flow area in the contiguous flow path at various locations along the circumference. Finally, cross-section 518 is a cross-section of a uniform contiguous flow path along about the circumference of the dotted circular line 512.

Figure 6:
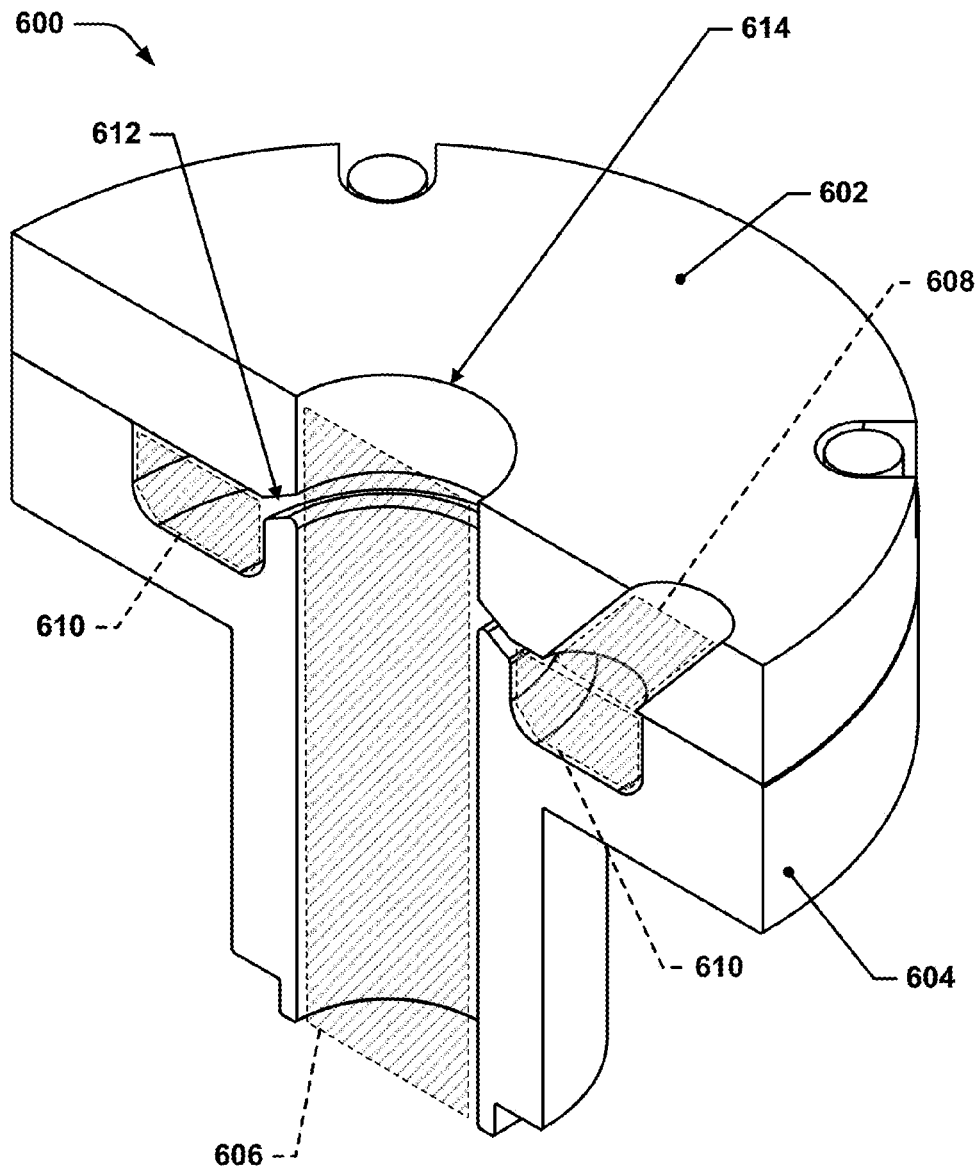
FIG. 6 shows depicts a view of another example showerhead inlet with a configuration different from the example showerhead inlet shown in FIG. 3.

In addition to the geometries detailed above, the present inventor have conceived of other configurations of showerhead inlets that may more uniformly mix precursor and carrier gas. FIG. 6 depicts a view of another example showerhead inlet with a configuration different from the example showerhead inlet shown in FIG. 3. The showerhead inlet 600 includes an upper showerhead inlet 602, a lower showerhead inlet 604, a precursor inlet 608, an annular plenum 610, a radial flow path 612, and a central passage 606.

Of note, the radial flow path 612 is similar to the configuration of the radial flow path 508 described in FIG. 5B. The radial flow path 612 may be defined by the upper showerhead inlet 602 and the lower showerhead inlet 604 and may be a flow path that may flow process gas into the central passage 606 from the entire inner diameter of the annular plenum 610. The radial flow path 612 may be at a shallow upward angle, e.g., formed between two facing, but offset, conical surfaces of the upper and lower showerhead inlets 602 and 604, respectively. Additionally, in certain other implementations, the surface defining the top of the radial flow path on the upper showerhead inlet may have a different cone angle that that of the surface defining the bottom of the radial flow path on the lower showerhead inlet. In this example, the cut-out defining the top and bottom of the radial flow path 612 may be the same angle. Additionally, the showerhead inlet 600 may be configured to flow only a first process gas, and thus the showerhead inlet 600 does not include a second process gas passage.

Figure 7:
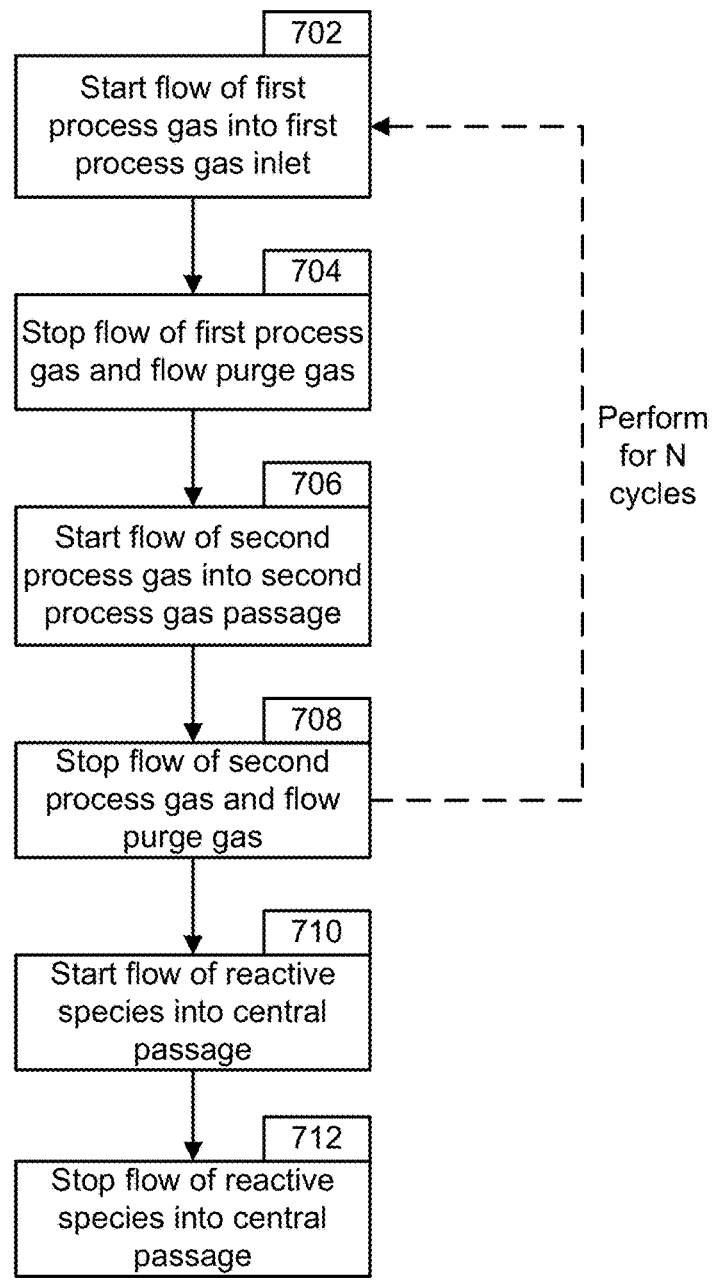
FIG. 7 shows a flow diagram detailing an example substrate processing sequence using a showerhead inlet.

The showerhead inlets described above may be used in substrate processing operations. FIG. 7 shows a flow diagram detailing an example substrate processing sequence using a showerhead inlet. In some implementations, a controller may be used, as part of a system, to control the processing of the substrates. Such systems may comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software (stored, for example, in volatile or non-volatile memory) that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed among one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller may communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The sequence described in FIG. 7 may use the showerhead inlets described in FIGS. 3A and 3B to process substrates. The sequence may begin in block 702, where the flow of the first process gas into the first process gas inlet is started. The first process gas may then flow via the annular plenum, the radial flow paths, the central passage, the riser paths, and the first process gas showerhead flow paths into a substrate processing chamber for adsorption by a substrate. Block 702 may correspond to a start of a dose phase as outlined in FIG. 2.

After block 702, the sequence may then proceed to block 704. In block 704, the flow of the first process gas into the first process gas inlet is stopped. Block 704 may correspond to an end of the dose phase as outlined in FIG. 2. In certain implementations, block 704 may stop the flow of a precursor, but a purge or carrier gas may continue to flow into the first process gas inlet to purge the flow paths within the showerhead and showerhead inlet of precursor as well as prevent backwash of process gases.

After block 704, the sequence may then proceed to block 706. In block 706, the flow of the second process gas into the second process gas passage commences. The second process gas may flow via the second process gas passage and the second process gas showerhead flow paths into the substrate processing chamber. The second process gas may react with the first process gas adsorbed by the substrate. Block 704 may correspond to the beginning of a delivery of reactant gas of a conversion phase as outlined in FIG. 2.

After block 706, the sequence may then proceed to block 708. In block 708, the flow of the second process gas into the second process gas passage is stopped. Block 708 may correspond to the end of the delivery of reactant gas of the conversion phase as outlined in FIG. 2. If necessary, another purge operation may be performed after the second process gas flow is stopped.

After block 708, a reactive species may be introduced into the central passage in block 710. The reactive species may be for cleaning purposes and may flow through the central passage and riser paths of the showerhead inlet and through the showerhead into the substrate processing chamber. The flow of the reactive species may be controlled by the RPS valve and the reactive species may be introduced by opening the RPS valve. Certain implementations may only introduce the reactive species into the showerhead inlet during cleaning sequences while other implementations may introduce the reactive species into the showerhead inlet during a deposition step. In some implementations, a purge or carrier gas, such as the purge or carrier gas component of the first process gas, may continue to flow when the reactive species is introduced. In other implementations, the purge or carrier gas may not flow when the reactive species is introduced.

After the reactive species flow has been performed, in block 710, the RPS valve may then be closed to shut off the flow of the reactive species into the central passage in block 712. After the closing of the RPS valve, a purge gas may be flowed through the showerhead inlet to purge any reactive species remaining within the showerhead inlet and showerhead.

In certain implementations, blocks 702-08 may be a part of a deposition cycle that is repeated a plurality of instances to process substrates. After a set number of deposition cycles have been performed, blocks 710 and 712 may then be performed to clean the substrate processing apparatus. Accordingly, FIG. 7 shows a broken line to signify that blocks 702-08 may optionally be performed for N cycles before block 710 and 712 is performed.

The equipment described herein may be connected with various other pieces of equipment, e.g., a semiconductor process chamber, in a semiconductor processing tool. Typically, a semiconductor processing tool using a showerhead inlet such as that described herein may be connected with a controller in communicative contact with various elements of the processing tool. Such a controller may include one or more processors and a memory that stores instructions for controlling the semiconductor processing tool as well as any process gas sources. The instructions may include, for example, instructions to control the flow rates of various process gases and/or reactive species used during semiconductor processing as well as any valves that may control the flow of the process gases and/or reactive species. As discussed above, the controller may typically include one or more memory devices for storing instructions and one or more processors configured to execute those instructions such that the apparatus will perform a method in accordance with the present disclosure. Machine-readable media containing instructions for controlling process operations in accordance with the present disclosure may be coupled to the system controller.

The apparatus/process described hereinabove may be used in conjunction with lithographic patterning tools or processes, for example, for the fabrication or manufacture of semiconductor devices, displays, LEDs, photovoltaic panels and the like, as well as dry etch, wet etch, dielectric deposition, atomic layer deposition/etch, and other semiconductor manufacturing processes. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper. Other semiconductor manufacturing processes may follow other process steps.

It will also be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations can be selectively combined to provide one or more comprehensive, but slightly different, technical solutions. It will therefore be further appreciated that the above description has been given by way of example only and that modifications in detail may be made within the scope of the disclosure.

What is claimed is:

1. An apparatus for supplying process gases to a gas distribution showerhead, the apparatus comprising:
    a central passage comprising a first end and a second end, the central passage configured to fluidically connect to an inlet of the gas distribution showerhead and to cause gases introduced into the central passage to flow to the inlet to the gas distribution showerhead by flowing the gases into the gas distribution showerhead in a first direction;
    an annular first plenum;
    a first inlet fluidically connected to the first plenum; and
    at least one radial flow path fluidically connecting the plenum and the central passage, each radial flow path angled so as to flow a first process gas from the first plenum and into the central passage along a direction having a component opposite in direction to the first direction, wherein:
        the first process gas is provided to the first plenum via the first inlet,
        the first end is located in between the radial flow path and a portion of the apparatus configured to be connected with the gas distribution showerhead,
        the second end is located such that the radial flow path is interposed between the second end and the first end,
        the second end is configured to be connected with a second process gas valve and includes a second inlet for the second process gas, the second inlet configured to flow the second process gas from the second end to the first end, and
        at least a portion of the central passage is between the area where the radial flow path connects to the central passage and the first end.

2. The apparatus of claim 1, wherein the second end includes a valve component configured to regulate the flow of the second process gas through the second inlet and into the central passage.

3. The apparatus of claim 1, wherein the central passage is cylindrical in shape and the portion of the central passage between the area where the radial flow path joins the central passage and the second end is at least one central passage diameter in length.

4. The apparatus of claim 1, wherein the second process gas is a reactive species.

5. The apparatus of claim 1, wherein the at least one radial flow path is angled such that each radial flow path directs the first process gas along a flow direction at an angle of between 100 to 170 degrees from the first direction.

6. The apparatus of claim 1, wherein the radial flow path comprises a plurality of radial passages, each equal in length and cross-sectional flow area.

7. The apparatus of claim 6, wherein the plurality of radial passages are distributed around the central passage in a substantially equally-spaced manner.

8. The apparatus of claim 7, wherein the plurality of radial passages are distributed to flow the first process gas into the central passage in a manner that creates turbulent flow of the first process gas in at least a portion of the central passage.

9. The apparatus of claim 8, the central passage further comprising a first end and a second end, wherein:
    the first end is located in between the radial flow path and a portion of the apparatus configured to be connected with the gas distribution showerhead,
    the second end is located such that the radial flow path is interposed between the second end and the first end, and
    at least a portion of the turbulent flow of the first process gas is created between the area where the radial flow path connects to the central passage and the second end.

10. The apparatus of claim 1, the radial flow path comprising a plurality of radial passages such that:
    the plurality of radial passages includes at least a first radial passage and a second radial passage; and
    the first radial passage and the second radial passage are angled at different angles.

11. The apparatus of claim 1, wherein the radial flow path comprises a single radial passage.

12. The apparatus of claim 1, further comprising:
    a secondary passage fluidically isolated from the central passage and configured to flow a third process gas in the first direction; and a second inlet fluidically connected to the secondary passage.

13. The apparatus of claim 1, further comprising:
the gas distribution showerhead, wherein the gas distribution showerhead is fluidically connected to the central passage.

14. The apparatus of claim 13, further comprising a secondary passage fluidically isolated from the central passage and configured to flow a third process gas in the first direction and a second inlet fluidically connected to the secondary passage, wherein:
the gas distribution showerhead includes a first distribution plenum and a second distribution plenum, wherein the first distribution plenum and the second distribution plenum are fluidically isolated from one another within the gas distribution showerhead,
the central passage is fluidically connected to the first distribution plenum of the gas distribution showerhead, and
the secondary passage is fluidically connected to the second distribution plenum of the gas distribution showerhead.

15. The apparatus of claim 14, further comprising a plurality of riser passages in a radial pattern, fluidically connected to the central passage and the first distribution plenum, and substantially centered on, and fluidically isolated from, the secondary passage.

16. The apparatus of claim 15, wherein at least a portion of the secondary passage is between at least two of the riser passages.

17. An apparatus for processing semiconductor wafers, the apparatus comprising:
a first process gas valve fluidically connected to a first inlet of a showerhead inlet and configured to flow a first process gas into the first inlet;
a carrier gas valve fluidically connected to the first inlet and configured to flow a carrier gas into the first inlet;
a second process gas valve fluidically connected to a central passage of the showerhead inlet and configured to flow a second process gas into the central passage;
a semiconductor processing gas distribution showerhead;
the showerhead inlet configured to supply gases to the semiconductor processing gas distribution showerhead, the showerhead inlet including:
the central passage comprising a first end and a second end the central passage configured to flow gases introduced into the central passage to the gas distribution showerhead by flowing the gases into the gas distribution showerhead in a first direction,
an annular first plenum,
the first inlet fluidically connected to the first plenum, and
at least one radial flow path fluidically connecting the plenum and the central passage, each radial flow path angled so as to flow the first process gas and/or the carrier gas from the first plenum and into the central passage along a direction having a component opposite in direction to the first direction, wherein the first process gas and/or the carrier gas is provided to the first plenum via the first inlet, wherein:

the first end is located in between the radial flow path and a portion of the apparatus configured to be connected with the gas distribution showerhead,
the second end is located such that the radial flow path is interposed between the second end and the first end,
the second end is configured to be connected with the second process gas valve and includes a second inlet for the second process gas, the second inlet configured to flow the second process gas from the second end to the first end, and
at least a portion of the central passage is between the area where the radial flow path connects to the central passage and the first end; and
a controller with one or more processors and a memory, wherein the one or more processors, the memory, the first process gas valve, and the second process gas valve are communicatively connected and the memory stores program instructions for controlling the one or more processors to:
(i) cause the carrier gas valve to flow the carrier gas into the first inlet,
(ii) cause the first process gas valve to flow the first process gas into the first inlet; and
(iii) cause, after (ii), the first process gas valve to stop the flow of the first process gas into the first inlet.

18. The apparatus of claim 17, wherein the memory stores further program instructions for controlling the one or more processors to:
(iv) cause, after (iii), the second process gas valve to flow the second process gas into the central passage; and
(v) cause, after (iv), the second process gas valve to stop the flow of the second process gas into the central passage.

19. The apparatus of claim 17, further comprising a third process gas valve, wherein:
the showerhead inlet further comprises a secondary passage fluidically isolated from the central passage and configured to flow a third process gas in the first direction and a second inlet fluidically connected to the secondary passage and the third process gas valve,
the third process gas valve is configured to regulate the flow of the third process gas to the secondary inlet,
the gas distribution showerhead includes a first distribution plenum and a second distribution plenum, wherein the first distribution plenum and the second distribution plenum are fluidically isolated from one another within the gas distribution showerhead,
the central passage is fluidically connected to the first distribution plenum of the gas distribution showerhead,
the secondary passage is fluidically connected to the second distribution plenum of the gas distribution showerhead, and
the memory stores further program instructions for controlling the one or more processors to:
(iv) cause, after (iii), the third process gas valve to flow the third process gas into the secondary inlet; and
(v) cause, after (iv), the third process gas valve to stop the flow of the third process gas into the secondary inlet.

* * * * *